US006420938B1

United States Patent
Hoff et al.

(10) Patent No.: US 6,420,938 B1
(45) Date of Patent: Jul. 16, 2002

(54) SOFTWARE CONTROLLED CRYSTAL OSCILLATOR

(76) Inventors: Lawrence Hoff, 3627 Tennyson St., San Diego, CA (US) 92106; David Buck, 3630 Wilcox St., San Diego, CA (US) 92106

( * ) Notice: Subject to any disclaimer, the term of this patent is extended or adjusted under 35 U.S.C. 154(b) by 0 days.

(21) Appl. No.: 09/651,829

(22) Filed: Aug. 30, 2000

(51) Int. Cl.$^7$ ................................................. H03L 1/02
(52) U.S. Cl. ................... 331/176; 331/116 R; 331/158; 331/44; 331/66
(58) Field of Search ................................ 331/176, 158, 331/116 R, 44, 66

(56) References Cited

U.S. PATENT DOCUMENTS

| | | | |
|---|---|---|---|
| 4,872,765 A | 10/1989 | Schodowski | 374/117 |
| 4,949,055 A | 8/1990 | Leitl | 331/158 |
| 5,041,800 A | 8/1991 | Long et al. | 331/69 |
| 5,042,288 A | 8/1991 | Vig | 73/24 |
| 5,081,431 A | 1/1992 | Kubo et al. | 33/158 |
| 5,149,197 A | 9/1992 | Rokos et al. | 374/117 |
| 5,160,901 A | 11/1992 | Stone | 331/37 |
| 5,214,668 A | 5/1993 | Satou et al. | 374/117 |
| 5,309,116 A | 5/1994 | Stone | 331/37 |
| 5,525,936 A | * 6/1996 | Post et al. | 331/47 |
| 5,604,468 A | 2/1997 | Gillig | 331/176 |
| 5,686,779 A | 11/1997 | Vig | 310/366 |
| 5,717,402 A | 2/1998 | Chu | 342/357 |
| 5,869,763 A | 2/1999 | Vig et al. | 73/580 |
| 5,965,817 A | 10/1999 | Schwarz et al. | 73/579 |

OTHER PUBLICATIONS

Klapper, et al., "Phase–Locked and Frequency–Feedback System", Academic Press, New York, pp. 42–47 (1972).
Gagliardi; "Introduction to Communications Engineering"; Second Edition, John Wiley & Sons, New York, pp. 216–217 (1988).
Garvey, et al.; "An Exact Spectral Analysis of a Number Controlled Oscillator Based Synthesizer", Proceedings of the 44$^{th}$ Annual Frequency Control Symposium, pp. 551–521 (1990).

Schodowski, "Resonator Self–Temperature–Sensing using a Dual–Harmonic–Mode Crystal Oscillator"; Proceedings of 43$^{rd}$ Annual Symposium on Frequency Control (May 31–Jun. 2, 1989)); pp. 2–7.

Benjaminson, et al.; "A Microcomputer–Compensated Crystal Oscillator Using Dual–Mode Resonator", Proceedings of the 43$^{rd}$ Annual Symposium on Frequency Control; pp. 20–26 (1989).

Benjaminson, et al.; "Performance Tests on an MCXO Combining ASIC and Hybrid Construction"; 45$^{th}$ Annual Symposium on Frequency Control; pp. 393–397 (1996).

* cited by examiner

*Primary Examiner*—Arnold Kinkead
(74) *Attorney, Agent, or Firm*—Fitch, Even, Tabin & Flannery

(57) ABSTRACT

A software controlled crystal oscillator employing a method for digitally controlling a reference frequency of an oscillator, the method includes the steps of: locking a first signal produced by a first tunable software oscillator on to a first resonant frequency of a temperature sensing resonator; locking a second signal produced by a second tunable software oscillator on to a second resonant frequency of the temperature sensing resonator; estimating a temperature of the temperature sensing resonator using the first signal and the second signal; estimating the first resonant frequency and the second resonant frequency based upon the temperature; and adjusting the first signal to approximate the estimated first resonant frequency. An additional step includes controlling the reference frequency of the oscillator based upon the first signal such that the reference frequency is compensated for temperature.

39 Claims, 8 Drawing Sheets

SOFTWARE CONTROLLED CRYSTAL OSCILLATOR

The invention described herein may be subject to limited Government rights and licenses pursuant to the Government Waiver of Invention Rights under Contract No. N66001-93-D-0116, D.O. No. 0090 awarded by SPAWAR Systems Center.

BACKGROUND OF THE INVENTION

The present invention relates to oscillators, and more specifically to oscillators controlled in part by a temperature sensing resonator to produce a stable reference frequency. Even more specifically, the present invention relates to oscillators controlled by a software algorithm that uses a temperature sensing resonator passively to produce a very stable reference frequency.

A microcomputer-controlled crystal oscillator (also referred to as an MCXO) is a type of oscillator, also referred to as a frequency generator or a clock, that produces a very stable reference frequency or reference timing under a variety of temperature conditions. As is known in the art, an MCXO employs a strain compensated cut crystal, also referred to as an "S/C cut crystal" or a dual mode crystal oscillator to produce the stable reference frequency. A strain compensated cut crystal is described in U.S. Pat. No. 4,872,765 issued Oct. 10, 1989 to Schodowski, entitled DUAL MODE THERMOMETRIC SENSING DEVICE, hereinafter referred to as the '765 patent, and which is incorporated herein by reference.

The MCXO actively uses the S/C cut crystal to provide temperature compensation of the output of the MCXO, which typically is produced by a voltage controlled crystal oscillator (VCXO) driven by the S/C cut crystal. For example, an S/C cut crystal dual mode resonator simultaneously excites, energizes, or stresses two modes of oscillation such that two frequencies are generated, e.g. a fundamental resonant frequency and an overtone resonant frequency. Advantageously, the relationship between the two generated resonant frequencies provides information about the exact temperature of the S/C cut crystal. As is conventionally done, the beat frequency is used to correct the MCXO output clock frequency for crystal temperature drift.

The MCXO consists of both analog and digital circuits. The analog circuits consist of discrete analog components, plus an S/C cut crystal, and a VCXO. The discrete components are for a dual mode resonator and an electrical network for separating the fundamental and overtone resonant frequencies. The digital circuit consists of both discrete and integrated electronic components.

Attempts have been made to reduce the size, power and cost of the MCXO; however, in such attempts, discrete analog components were still required. For example, discrete inductors are used to separate the fundamental and overtone resonant frequencies of the S/C cut dual mode crystal resonator, which are essential to the temperature compensation of the MCXO. Disadvantageously, these discrete analog components place a limit on the miniaturization of the device, require additional power and increase the cost of the device.

Additionally, in the conventional MCXO design, the S/C cut crystal is used as an active element, i.e. a resonator or a frequency generator that requires power, such that one of the resonant frequencies excited in the S/C cut crystal is directly used to derive the VCXO's frequency corrections due to temperature changes. The temperature is determined by the relationship between the resonant frequencies of the S/C cut crystal to generate the stable reference frequency.

The present invention advantageously addresses the above and other needs.

SUMMARY OF THE INVENTION

The present invention advantageously addresses the needs above as well as other needs by providing a software controlled crystal oscillator including a software algorithm that uses a temperature sensing resonator as a passive element in order to control an oscillator which produces a very stable reference frequency over a wide temperature range.

In one embodiment, the invention can be characterized as a method for digitally controlling a reference frequency of an oscillator comprising the steps of: locking a first signal produced by a first tunable software oscillator on to a first resonant frequency of a temperature sensing resonator; locking a second signal produced by a second tunable software oscillator on to a second resonant frequency of the temperature sensing resonator; estimating a temperature of the temperature sensing resonator using the first signal and the second signal; estimating the first resonant frequency and the second resonant frequency based upon the temperature; and adjusting the first signal to approximate the estimated first resonant frequency.

In another embodiment, the invention can be characterized as a software controlled crystal oscillator including a controllable oscillator generating a reference frequency, a digital processor coupled to the oscillator via a first digital to analog converter for controlling the reference frequency of the oscillator and a temperature sensing resonator coupled to the digital processor via a second digital to analog converter. Also included is an analog to digital converter coupling an output of the temperature sensing resonator to the digital processor. The temperature sensing resonator produces a signal having a plurality of resonant frequencies that are related to each other by temperature, and the digital processor estimates the temperature of the temperature sensing resonator and controls the reference frequency of the oscillator based upon the temperature.

In yet another embodiment, the invention can be characterized as a system for controlling the reference frequency of an oscillator comprising a processor including a program for performing the following steps: locking a first signal produced by a first tunable software oscillator on to a first resonant frequency of a temperature sensing resonator; locking a second signal produced by a second tunable software oscillator on to a second resonant frequency of the temperature sensing resonator; estimating a temperature of the temperature sensing resonator using the first signal and the second signal; estimating the first resonant frequency and the second resonant frequency based upon the temperature; and adjusting the first signal to approximate the estimated first resonant frequency.

In a further embodiment, the invention can be characterized as a digitally implemented system for controlling a reference frequency of an oscillator comprising a first tunable software oscillator producing a signal to be output to a temperature sensing resonator and a first correlator detector coupled to the first tunable software oscillator, the first correlator detector having an output to control the oscillator that produces the reference frequency. A second tunable software oscillator produces another signal to be output to the temperature sensing resonator and a second correlator detector is coupled to the second tunable software oscillator. An input is also included for receiving an (output signal from the temperature sensing resonator, wherein the input is coupled to the first correlator detector and the second correlator detector. And a temperature frequency compensator is coupled to the first tunable software oscillator and the second tunable software oscillator. The temperature frequency compensator estimates the temperature of the temperature sensing resonator and adjusts the frequency of the signal and the other signal based upon the temperature.

In an additional embodiment, the invention can be characterized as a method of using a temperature sensing resonator oscillator as a filter for controlling a reference frequency of an oscillator including the steps of: digitally generating a first clock signal and a second clock signal, wherein the first clock signal and the second clock signal have the same frequency and the second clock signal is related in phase to the first clock signal; driving the temperature sensing resonator with the second clock signal; correlating the first clock signal with an output of the temperature sensing resonator; and generating, in response to the correlating, a signal to be output to the oscillator, wherein the signal controls the reference frequency of the oscillator.

BRIEF DESCRIPTION OF THE DRAWINGS

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE PREFERRED EMBODIMENTS

The following description of the presently contemplated best mode of practicing the invention is not to be taken in a limiting sense, but is made merely for the purpose of describing the general principles of the invention. The scope of the invention should be determined with reference to the claims.

Figure 1:
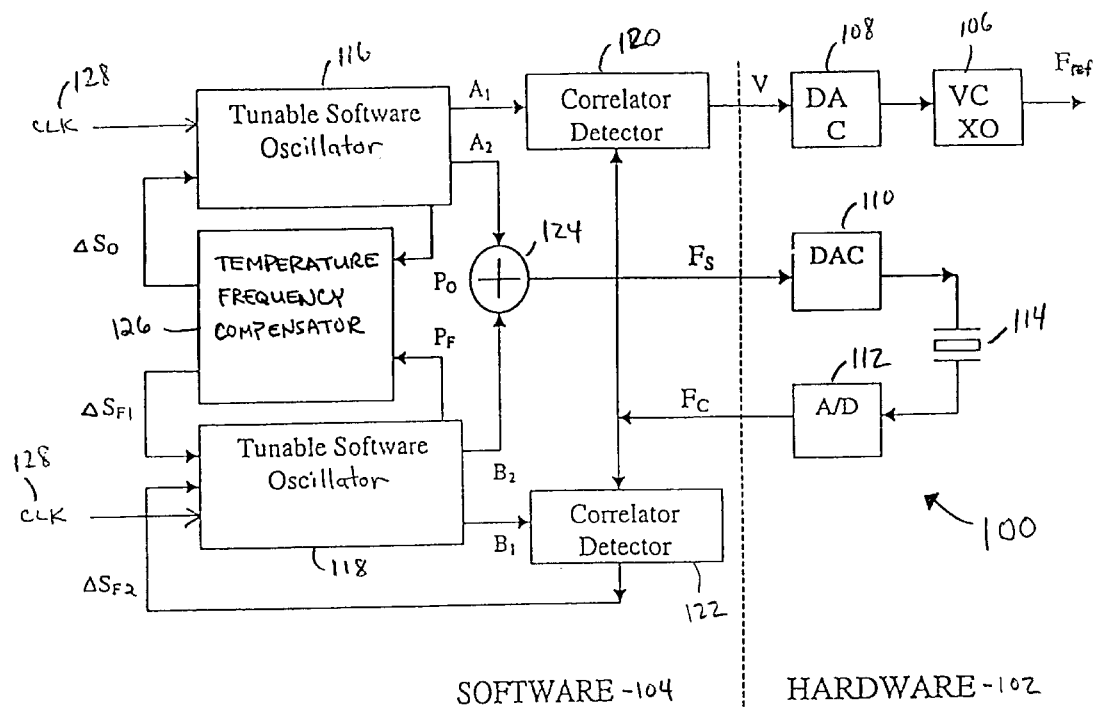
FIG. 1 is a system block diagram of a software controlled crystal oscillator in accordance with one embodiment of the present invention.

Referring first to FIG. 1, a system block diagram is shown of a software controlled crystal oscillator in accordance with one embodiment of the present invention. Shown is a software controlled crystal oscillator 100 (also referred to as an SCXO 100) having a hardware portion 102 and a software portion 104. The hardware portion 102 includes a voltage controlled crystal oscillator 106 (hereinafter referred to as a VCXO 106 or generically as a "controllable oscillator" 106), a first digital to analog converter 108 (hereinafter referred to as a first DAC 108), a second digital to analog converter 110 (hereinafter referred to as a second DAC 110), an analog to digital converter 112 (hereinafter referred to as an ADC 112), and a strain compensated cut crystal 114 (also referred to as an S/C cut crystal 114 and more generically referred to as a "temperature sensing resonator 114" or temperature sensing crystal resonator). The software portion 104 includes a first tunable software oscillator 116, a second tunable software oscillator 118, a first correlator detector 120, a second correlator detector 122, a summer 124, and a temperature frequency compensator 126. The first tunable oscillator 116 and the second tunable oscillator 118 each have clock input 128. Also shown are digital signals $A_1$, $A_2$, $B_1$, $B_2$, $F_S$, $F_C$ and V, step size adjustment $\Delta S_O$, $\Delta S_{F1}$ and $\Delta S_{F2}$, coefficients $P_O$ and $P_F$, and reference frequency $F_{ref}$.

The first tunable software oscillator 116 is coupled to the first correlator detector 120, the summer 124 and the temperature frequency compensator 126. The second tunable software oscillator 118 is coupled to the second correlator detector 122, the summer 124 and the temperature frequency compensator 126. A clock input 128 is coupled to the both the first tunable software oscillator 116 and the second tunable software oscillator 118. The summer 124 is coupled to the second DAC 110, which is coupled to an input of the S/C cut crystal 114 (referred to generically as temperature sensing resonator 114). The output of the SIC cut crystal 114 is coupled to the ADC 112, which is coupled to both the first correlator detector 120 and the second correlator detector 122. The first correlator detector 120 is coupled to the first DAC 108, which is coupled to the VCXO 106, which produces the reference frequency.

In operation, the software controlled crystal oscillator 100 (SCXO) provides an entirely software controlled implementation of the conventional microcomputer-controlled crystal oscillator (MCXO), as well as includes other features which result in significant improvement over traditional designs. Thus, the SCXO 100 provides and processes signals that are used to sense the temperature of an S/C cut crystal 114, and controls a VCXO 106 to produce a stable reference frequency over a wide range of temperatures. Advantageously, the discrete analog components required in earlier attempts at a digital implementation of the MCXO are eliminated. For example, the embodiment of FIG. 1 does not require inductors or capacitors to separate the resonant frequencies (e.g. filter unwanted frequencies and noise) produced by an S/C cut crystal used in an active mode according to the MCXO. Furthermore, as will be described, the S/C cut crystal 114 is used passively as a temperature sensor, as opposed to actively as is conventionally done in an MCXO. This means that the S/C cut crystal 114 is used passively as a filter which does not require power, as opposed to using the S/C cut actively as a resonator (or frequency generator), which requires power to the S/C cut crystal.

The components of the software portion 104 of the SCXO 100 interface with the VCXO 106 via the first DAC 108 and interface with the S/C cut crystal 114 via the second DAC 110 and the ADC 112. Thus, advantageously, the only hardware components required for the SCXO 100 include the VCXO 106, the S/C cut crystal 114, the first DAC 108, the second DAC 110, and the ADC 112. It is noted that the VCXO 106 is one example of a "controllable oscillator" that may be used, for example, a phase locked loop or PLL, as known in the art, may replace the VCXO 106 as the "controllable oscillator" of the hardware portion 102.

Advantageously, the software portion 104 of the SCXO 100 may be implemented in embedded programmable devices, e.g. a field programmable gate array (FPGA) or in digital devices, e.g. a general purpose processor, an application specific integrated circuit (ASIC) or a custom digital signal processor. Thus, the software portion 104 is implemented as a program that is executed on a processor, wherein the components of the hardware portion 102 are coupled to the processor executing the program represented functionally in the software portion 104 of FIG. 1. Thus, the various components of the software portion, e.g. the first tunable software oscillator 116, the second tunable software oscillator 118, the first correlator detector 120, the second correlator detector 122, the summer 124, the modulators 202 (see FIG. 2), and the temperature frequency compensator 126 are all functional modules of the program which is executed on a processor. It is also noted that the program to implement the software portion 104 of the SCXO 100 can be created by the skilled artist without undue experimentation, given the description of the functionality (i.e. the functional modules) of the software portion 104 throughout the specification and that much of the individual functionality of the software portion 104 is well known in the art.

Advantageously, the size of the SCXO 100 is dramatically reduced in comparison to known MCXOs, while the SCXO 100 provides a reference frequency that is as stable as the reference frequency provided by the MCXO and an Oven Controlled Crystal Oscillator (OCXO) over a wide range of temperatures. This reduction in size makes the SCXO 100 desirable in applications requiring a stable clock in small packages, for example in communications devices requiring very stable clocks, e.g. GPS receivers or cellular telephones. Furthermore, the SCXO 100 will consume less power than a conventional MCXO requiring analog components.

In operation, the S/C cut crystal 114, is used to provide two band-pass filters, one at its fundamental resonant frequency and another at an overtone resonant frequency, e.g. the third overtone resonant frequency. The SCXO 100 uses the relationship between these two resonant frequencies to determine the actual temperature of the S/C cut crystal 114. Knowing the temperature of the S/C cut crystal 114, a precise estimate of the resonant frequencies is then known, which is used to adjust the reference frequency of the VCXO 106 to the desired value. Although an S/C cut crystal 114 is specifically used, this embodiment of the present invention may use any temperature sensing resonator, which is defined as a crystal resonator having multiple resonant frequencies in which two or more of the resonant frequencies define a relationship that relates to the temperature of the temperature sensing resonator. In other words, the relationship between the two or more resonant frequencies provides information about the temperature of the temperature sensing resonator. An S/C cut crystal 114 is an example of such a temperature sensing resonator.

While describing the components of the SCXO 100 of FIG. 1, concurrent reference will be made to FIG. 3, which illustrates a flowchart of the steps performed by the software algorithm of the software controlled crystal oscillator of FIGS. 1 and 2 in order to control the reference frequency $F_{ref}$ of the controllable oscillator, e.g. VCXO 106.

When the SCXO 100 is powered on, the VXCO 106 is designed to produce a reference frequency or clock signal $F_{ref}$. However, depending on the temperature of the VCXO 106 itself, the exact value of the reference frequency is variable, i.e. the reference frequency has an unknown error at power on. It is the function of the SCXO 100 to adjust the reference frequency to the desired frequency and further maintain the reference frequency at the desired frequency despite temperature changes during operation.

The SCXO 100 adjusts and maintains the reference frequency at the desired value over a wide range of temperatures in an all digital software algorithm using the S/C cut crystal 114 as a passive filter. Thus, at power on, the SCXO 100 is initialized (Step 302 of FIG. 3). In this embodiment, initialization requires at least that the start up values for the step sizes ($S_O$ and $S_F$) are set for both the first tunable software oscillator 116 and the second tunable software oscillator 118 and that the step size adjustments ($\Delta S_O$ and $\Delta S_{F1}$) for both the first tunable software oscillator 116 and the second tunable software oscillator 118 are set to zero. The purpose of this initialization will be apparent below.

Once initialized, the first tunable software oscillator 116 is locked on to the overtone resonant frequency of the S/C cut crystal 114 (Step 304 of FIG. 3), preferably to the third overtone resonant frequency. This is accomplished in a feedback loop as follows. While describing this "locking on" step, concurrent reference is made to FIG. 4, which illustrates a flowchart of the steps performed by the software algorithm of the software controlled crystal oscillator of FIG. 1 and also FIG. 2 in order to "lock on" to the overtone resonant frequency of the temperature sensing resonator, i.e. FIG. 4 illustrates the steps in performing Step 304 of FIG. 3.

Figure 4:
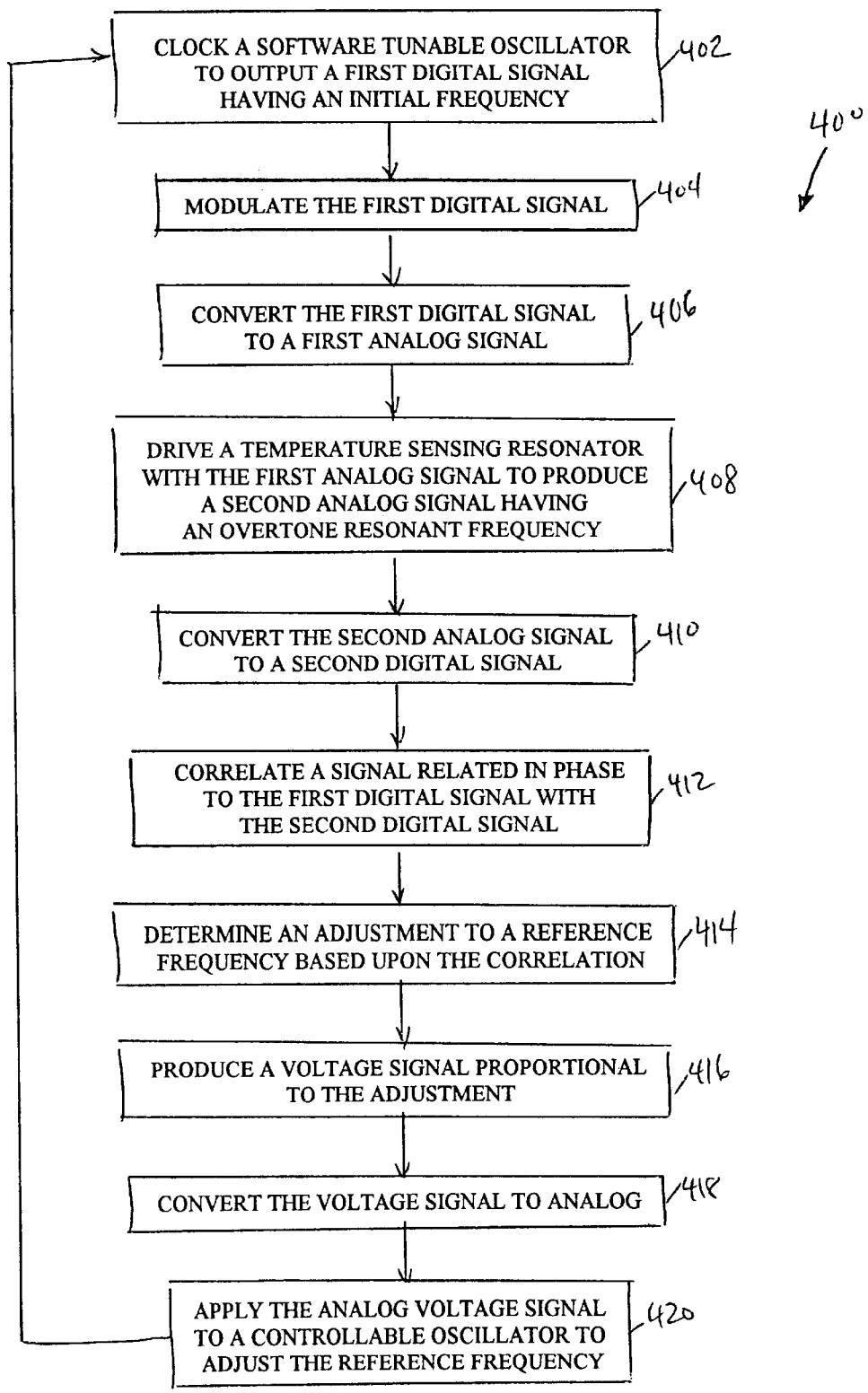
FIG. 4 is a flowchart of the steps performed by the software algorithm of the software controlled crystal oscillator of FIGS. 1 and 2 in order to lock on to an overtone resonant frequency of a temperature sensing resonator as stated in the flowchart of FIG. 3.

A first step in locking the first tunable software oscillator 116 to an overtone resonant frequency of the S/C cut crystal 114 is to clock the first tunable software oscillator 116 so that a digital signal (e.g. digital signal $A_2$) having an initial frequency will be output (Step 402 of FIG. 4). As such, a clock input 128 is fed into the first tunable software oscillator. In one embodiment, the clock input 128 is the output of the VCXO 106 at power on which is fed back into the first tunable software oscillator 116, although the clock input 128 may be any common input signal derived from the VCXO 106 using techniques that are known in the art. The first tunable software oscillator 116 generates a digital clock signal that is adjustable or tunable by the software. For example, the first tunable software oscillator 116 is a digitally implemented oscillator producing a digital signal at a desired frequency, e.g., a numerically controlled oscillator (NCO) as known in the art. Based on the input clock signal and according to values of $S_O$ and $\Delta S_O$ at initialization (i.e. $\Delta S_O=0$ at initialization), the first tunable software oscillator 116 generates a digital signal or waveform having an initial frequency which is desired to be locked to an overtone resonant frequency of the S/C cut crystal 114.

For example, if the clock input is the reference frequency, then the step size $S_O$ is set to scale the clock input and produce a digital signal, which hopefully corresponds to the overtone resonant frequency of the S/C cut crystal 114. Note that the clock input will include an unknown error due to the unknown temperature at power on; thus, the digital signal will not be at the overtone resonant frequency and, therefore, is to be locked on to the overtone resonant frequency.

The first tunable software oscillator 116 actually produces two digital signals or output waveforms, $A_1$ and $A_2$, which are related in phase to each other and each having the same initial frequency based upon the clock input, and the step size $S_O$. Preferably, digital signals $A_1$ and $A_2$ are orthogonal to each other (e.g. one representing the sine and the other representing the cosine), but may have other phase relationships. Thus, the digital signals $A_1$ and $A_2$ "correspond" to each other in that they are the same frequency, but offset in phase with respect to each other, i.e. digital signal $A_2$ is related in phase to digital signal $A_1$. Digital signal $A_1$ is fed into the first correlator detector, while digital signal $A_2$ is fed into summer 124, which sums the digital signal $A_2$ with a digital signal $B_2$ from the second tunable software oscillator 116 described below. The summer 124 is a sample by sample summer 124 such as known in the art. The output of the summer 124, i.e. digital signal $F_S$, is converted into an analog signal by the second DAC (Step 406 of FIG. 4). Note that Step 404 of FIG. 4 has been skipped in this embodiment; however, it is performed in the embodiment of FIG. 2. Next, the analog signal $F_S$ is input into the S/C cut crystal 114 (i.e. the S/C cut crystal is driven) to produce an analog signal having two resonant frequencies (Step 408 of FIG. 4), i.e. an overtone resonant frequency and a fundamental resonant frequency, as is known to the S/C cut crystal 114. Note that both the overtone and fundamental resonant frequencies also have an unknown error associated therewith also due to the unknown temperature of the S/C cut crystal 114.

Also note that the analog signal output from the S/C cut crystal 114 has two resonant frequencies due to the fact that a signal, e.g. digital signal $B_2$, (which is equal to, or nearly equal to, the fundamental resonant frequency of the S/C cut crystal) is produced by the second tunable software oscillator 118 and summed with the digital signal $A_2$. Note that in some embodiments, as discussed below, when the step 304 is performed before step 306, instead of simultaneously with step 306, that the analog signal output from the S/C cut crystal 114 has only one resonant frequency, e.g. the overtone resonant frequency, since the input signal from the second tunable software oscillator (i.e. digital signal $B_2$) is not yet produced.

This analog signal output from the S/C cut crystal is then digitized by the ADC converter 112 (Step 410 of FIG. 4) and input as digital signal $F_C$ into the software portion 104 of the SCXO 100. Preferably, the ADC 112 is an 8 bit converter. This is because the ADC 112 needs to be able to sample at the Nyquist rate, i.e. the sampling rate must be at least twice the highest analog frequency in the system. The digital signal $F_C$ is then input into both the first correlator detector 120 and the second correlator detector 122.

At the first correlator detector 120, the digital signal $F_C$ is correlated with the digital signal $A_1$ (which is related in phase, e.g. orthogonal, to digital signal $A_2$) from the first tunable software oscillator 116 (Step 412 of FIG. 4), i.e. the digital signal $A_1$ is multiplied with digital signal $F_C$ and integrated over time. Note that preferably $A_1$ is orthogonal to $A_2$ which was used to drive the S/C cut crystal 114; however, in other embodiments, $A_1$ and $A_2$ may have a different phase relationship. Thus, in the correlation, the overtone resonant frequency of the digital signal $F_C$ is separated from the fundamental resonant frequency of the digital signal $F_C$ in the correlation.

Furthermore, the correlation provides a phase shift of signaling through the S/C cut crystal 114 or the phase error between the digital signal $A_1$ from the first tunable software oscillator 116 and the digital signal $F_C$ including the overtone frequency from the S/C cut crystal 114. Thus, the first correlator detector 120 operates as a digital filter and a phase detector. Since in one embodiment, the digital signals $A_1$ and $A_2$ are orthogonal to each other at output of the first tunable software oscillator 116, the output $F_C$ of the S/C cut crystal 114 will remain orthogonal to $A_1$ only if the frequency of the signal $A_2$ is precisely on the resonant overtone frequency of the S/C cur crystal 114. As is typically the case, during the locking on process, the $A_1$ and the output $F_C$ of the S/C cut crystal 114 are not initially in alignment. Thus, the first correlator detector 120 produces a signal between +1 and −1 that measures the degree of correlation between the inputs $A_1$ and $F_C$. If the first correlator detector 120 output is zero, then $A_1$ and $F_C$ are orthogonal and the first tunable software oscillator 116 is locked to the overtone resonant frequency of the S/C cut crystal 114. If the output is positive, then the reference frequency $F_{ref}$ is too low and must be increased. If the output is negative, then the reference frequency is too high and must be decreased. The amount that the reference frequency is to be increased or decreased is determined using this correlation value.

It is noted that in some embodiments, the second DAC 110 and the ADC 112, or other components in the path of digital signal $A_2$ as it is translated into digital signal $F_C$ and transferred to the first correlator detector 120, may introduce phase offsets such that the digital signal $F_C$ may not be orthogonal even if the frequency of the digital signal $A_2$ is precisely on the resonant overtone frequency of the S/C cut crystal 114. This amount of phase offset may be compensated for by introducing a desired counter-acting phase offset in digital signal $A_2$ at the first tunable software oscillator 116. Thus, the digital signal $A_2$ may not be orthogonal with digital signal $A_1$ (although still be related in phase to $A_1$). However, preferably, at the time digital signal $A_2$ becomes $F_C$ at the input of the first correlator detector 120, the digital signal $F_C$ and $A_1$ are orthogonal when the frequency of the digital signal $A_2$ is precisely on the resonant overtone frequency of the S/C cut crystal 114.

Next, depending on the desired reference frequency, the first correlator detector 120 determines an adjustment to the VCXO 106 to adjust the reference frequency $F_{ref}$ based upon the correlation value (Step 414 of FIG. 4) and a voltage signal V is output which is proportional to this adjustment to the reference frequency (Step 416 of FIG. 4). The voltage signal V is converted to an-analog voltage signal (Step 418 of FIG. 4) and applied to the controllable oscillator, e.g. voltage controlled crystal oscillator 106 (VCXO) (Step 420 of FIG. 4). Thus, the reference frequency $F_{ref}$ produced by the VCXO 106 is adjusted to more accurately represent the desired frequency value, although again, the reference frequency still contains the error associated with the unknown temperature.

Next, to complete the feedback loop, the adjusted reference frequency $F_{ref}$ is fed back into the first tunable software oscillator 116 and Steps 402 through 420 of FIG. 4 are repeated. For example, the first tunable software oscillator 116 is clocked with the updated reference frequency. In the next iteration or loop, the clock input is scaled by the step size $S_O$ such that the output of the first tunable oscillator 116 has a frequency that is closer to the overtone resonant frequency of the S/C cut crystal 114 than it was initially. Again, output signal $A_2$ drives the S/C cut crystal 114 which outputs an analog signal which is digitized and input to the first correlator detector. Again, by correlating digital signals $A_1$ and $F_C$, the overtone resonant frequency is separated from the fundamental resonant frequency and the phase error is determined and further adjustments are made to the reference frequency $F_{ref}$, which is fed back to the first tunable software oscillator 116 until eventually, the outputs $A_1$ and $A_2$ are "locked" to the overtone resonant frequency of the S/C cut crystal 114. This is typically accomplished when the voltage signal V of the first correlator detector 120 output is close to zero, e.g. when $A_1$ and $F_C$ are orthogonal. It is important to note that although the first tunable software oscillator 116 is now locked to the overtone resonant frequency of the S/C cut crystal 114 and the reference frequency $F_{ref}$ is more stable, the produced reference frequency may still be offset from the desired frequency value due to the actual temperature of the S/C cut crystal 114 and the VCXO 106. It is noted that there may be other methods used to lock the first tunable software oscillator on to the overtone resonant frequency of the S/C cut crystal 114 and the method shown in FIG. 4 represents one such method.

Referring back to FIG. 3, the next step in software algorithm of the SCXO 100 of FIG. 1 is to lock on to the fundamental resonant frequency of the S/C cut crystal 114 (Step 306 of FIG. 3). It is noted that concurrent reference will be made to FIG. 5, which illustrates a flowchart of the steps performed by the software algorithm of the software controlled crystal oscillator of FIG. 1 and also of FIG. 2 in order to lock on to the fundamental resonant frequency of the temperature sensing resonator 114, i.e. FIG. 5 illustrates the steps in performing Step 306 of FIG. 3.

Figure 5:
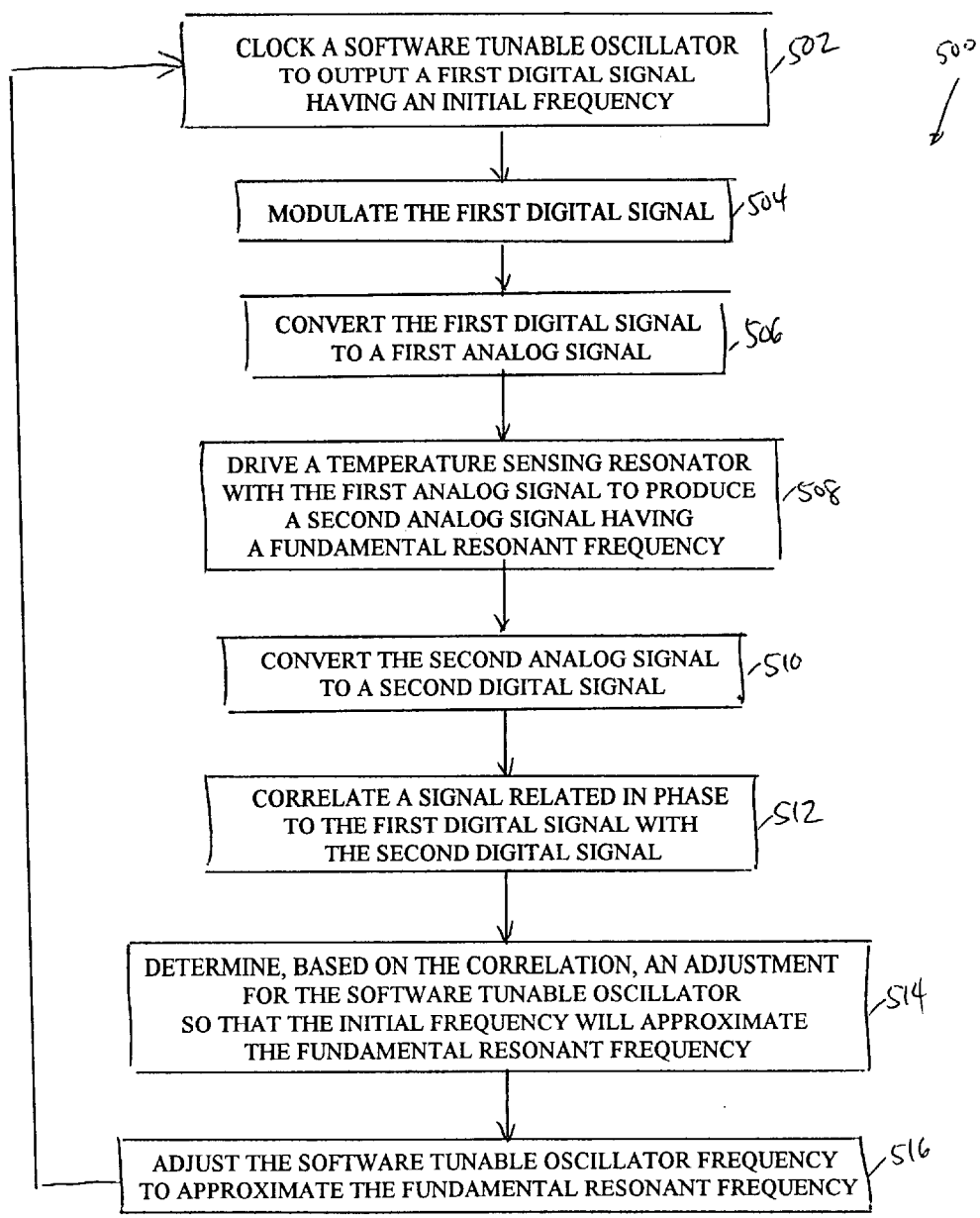
FIG. 5 is a flowchart of the steps performed by the software algorithm of the software controlled crystal oscillator of FIGS. 1 and 2 in order to lock on to a fundamental resonant frequency of the temperature sensing resonator as stated in the flowchart of FIG. 3.

The second tunable software oscillator 118 is clocked to produce a digital signal, e.g. digital signal $B_2$, having an initial frequency (step 502 of FIG. 5). Again, the clock input 128 to the second tunable software oscillator is preferably the reference frequency $F_{ref}$ fed back into the second tunable software oscillator 118, although the clock input 128 can be any clock input signal derived from the VCXO 106 using techniques that are known in the art. The second tunable software oscillator 118 is a digitally implemented oscillator producing a digital signal at a desired frequency, e.g., a numerical controlled oscillator (NCO) as is known in the art. At initialization, the step size $S_F$ of the second tunable software oscillator 118 is set to a value such that the digital signal output from the second tunable software oscillator 118 has an initial frequency that approximates the fundamental resonant frequency of the S/C cut crystal 114, although typically, it is not yet precisely "locked" to the fundamental resonant frequency. Furthermore, during initialization, the step size adjustment $\Delta S_{F1}$ is set to zero. The second tunable software oscillator 118 actually produces two digital output signals or waveforms, $B_1$ and $B_2$, both of which oscillate at the initial frequency which is desired to be at the fundamental resonant frequency, but which are related in phase. For example, in one embodiment, $B_1$ and $B_2$ are orthogonal to each other (i.e. a 90 degree phase shift), but in other embodiments, may have a differing phase relationship. Thus, the digital signals $B_1$ and $B_2$ "correspond" to each other in that they both have the same frequency, but are offset in phase relative to each other.

Furthermore, it is noted that the step of locking on to the overtone resonant frequency of the S/C cut crystal (Step 304 of FIG. 3) and the step of locking on to the fundamental resonant frequency of the S/C cut crystal (Step 306 of FIG. 3) may occur simultaneously or separately. Preferably, Step 304 of FIG. 3 is performed first, then Step 306 of FIG. 3 is performed second. This is advantageous since the digital signals $A_1$ and $A_2$ are already locked to the overtone resonant frequency of the S/C cut crystal 114, the clock input 128 to the second tunable software oscillator 118, which is the reference frequency, is not fluctuating due to the locking on process at the first tunable software oscillator 116.

Next, the digital signal $B_2$ is summed with the digital signal $A_2$ at the summer 124. The digital signal is then converted from a digital signal $F_S$ to an analog signal (Step 506 of FIG. 5) by the second DAC 110. This analog signal output from the second DAC 110 is used to drive the temperature sensing resonator 114 to produce a signal having the fundamental resonant frequency and the overtone resonant frequency (Step 508 of FIG. 5). Note that Step 504 has been skipped in the embodiment of the SCXO in FIG. 1, but is applicable in the embodiment of the SCXO shown in FIG. 2. The analog signal output from the S/C cut crystal 114 is then converted back to a digital signal $F_C$ (Step 510 of FIG. 5) by the ADC 112, as similarly described above.

Next, the digital signal $F_C$ is correlated with the digital signal $B_1$ output from the second tunable software oscillator 118 (Step 512 of FIG. 5) at the second correlator detector 122. Note that in one embodiment, digital signal $B_1$ is orthogonal to digital signal $B_2$, where signal $B_2$ provides digital signal $F_C$ via the S/C cut crystal 114. The correlation separates the fundamental resonant frequency from the overtone resonant frequency and provides a phase error between the digital signal $B_1$ from the second tunable software oscillator 118 and the digital signal $F_C$ including the overtone resonant frequency of the S/C cut crystal 114. Thus, the second correlator detector 122 operates as a digital filter and a phase detector. In one embodiment, since the digital signals $B_1$ and $B_2$ are orthogonal to each other at output of the second tunable software oscillator 118, the output $F_C$ of the S/C cut crystal 114 will remain orthogonal to $B_1$ only if the frequency of the digital signal $B_2$ is precisely on the resonant overtone frequency of the S/C cut crystal 114. As is typically the case, during the locking on process, the $B_1$ and the output $F_C$ of the S/C cut crystal 114 are not initially in alignment. Thus, the second correlator detector 112 produces a signal between +1 and −1 that measures the degree of correlation between the inputs $B_1$ and $F_C$. If the second correlator detector 122 output is zero, then $B_1$ and $F_C$ are orthogonal and the second tunable software oscillator is locked to the fundamental resonant frequency of the S/C cut crystal 114. If the output is positive, then the reference frequency is too low and must be increased. If the output is negative, then the reference frequency is too high and must be decreased. Note that in some embodiments, digital signals $B_1$ and $B_2$ may not be orthogonal, but offset in phase so that when phase offsets are introduced into the signal path of digital signal $B_2$ (e.g. by the second DAC 110 and the ADC 112), that $F_C$ and $B_1$ are advantageously orthogonal to each other when the frequency of the digital signal $B_2$ is precisely on the resonant overtone frequency of the S/C cut crystal 114.

Next, an adjustment is determined for the second tunable software oscillator 122 so it will output signals approximating the fundamental resonant frequency (Step 514 of FIG. 5). This determination is made at the second correlator detector 122 and is based upon the correlation value, i.e. the value between −1 and +1, at the second correlator detector. Then, a signal $\Delta S_{F2}$ is sent to the second tunable software oscillator 118 to adjust the digital signals $B_1$ and $B_2$ to more closely approximate the fundamental resonant frequency of the S/C cut crystal 114 (Step 516 of FIG. 5). Thus, $\Delta S_{F2}$ represents the incremental fast update (which may be positive or negative) to the step size SF to converge the frequency of the second tunable software oscillator 118 to the fundamental resonant frequency regardless of the clock input 128 used.

Next, to complete the loop, Steps 502 through 516 of FIG. 5 are repeated until the output signals $B_1$ and $B_2$ are locked on to the fundamental resonant frequency of the S/C cut crystal 114. This occurs as the adjustment signal $\Delta S_{F2}$ approaches zero. It is noted that there may be other methods used to lock the second tunable software oscillator 122 on to the fundamental resonant frequency of the S/C cut crystal 114 and the method shown in FIG. 5 represents one such method.

It is noted that in an alternative embodiment, the summer 124 of FIG. 1 is not used to combine digital signals $A_2$ and $B_2$. These signals $A_2$ and $B_2$ are combined outside of the software portion 104 in a digital to analog converter, e.g. second DAC 110 before being input to the S/C cut crystal 114. Additionally, there may be two digital to analog converters, one for each signal $A_2$ and $B_2$. In such embodiments, the software portion 104 does not include a summer 124 and has two digital outputs, i.e. digital signals $A_2$ and $B_2$, to be converted to analog and input to the S/C cut crystal 114 as one analog signal.

Now referring back to FIG. 3 while still describing the SCXO of FIG. 1, the next step is estimate the temperature of the S/C cut crystal 114 (also referred to as the temperature sensing resonator) (Step 308 of FIG. 3). This step is performed by the temperature frequency compensator 126 which is coupled to both the first tunable software oscillator 116 and the second tunable software oscillator 118. This is important because although the first tunable software oscillator 116 and the second tunable software oscillator 118 are now locked on to the overtone resonant frequency and the fundamental resonant frequency, respectively, and although the non-fluctuating reference frequency $F_{ref}$ is produced by the VCXO 106 and is being used as a clock signal for a particular device, this reference frequency $F_{ref}$ has an error associated with it due to the unknown temperature. This is because the temperature of the S/C cut crystal 114 and the VCXO 106 is unknown, and both of which are selected to produce waveforms which are a desired value at nominal temperatures. Once the actual temperature of the S/C cut crystal 114 is known, then the actual values of the overtone resonant frequency and the fundamental resonant frequency can be determined. In the embodiment of FIG. 1, the reference frequency is based upon a digital signal which is locked on to the overtone resonant frequency of the S/C cut crystal 114. Thus, once the actual overtone resonant frequency of the S/C cut crystal 114 is known, then the frequency of the first tunable software oscillator 116 is adjusted to force the reference frequency $F_{ref}$ very precisely to the desired frequency value, which eliminates the error and provides a temperature invariant clock signal.

Figure 2:
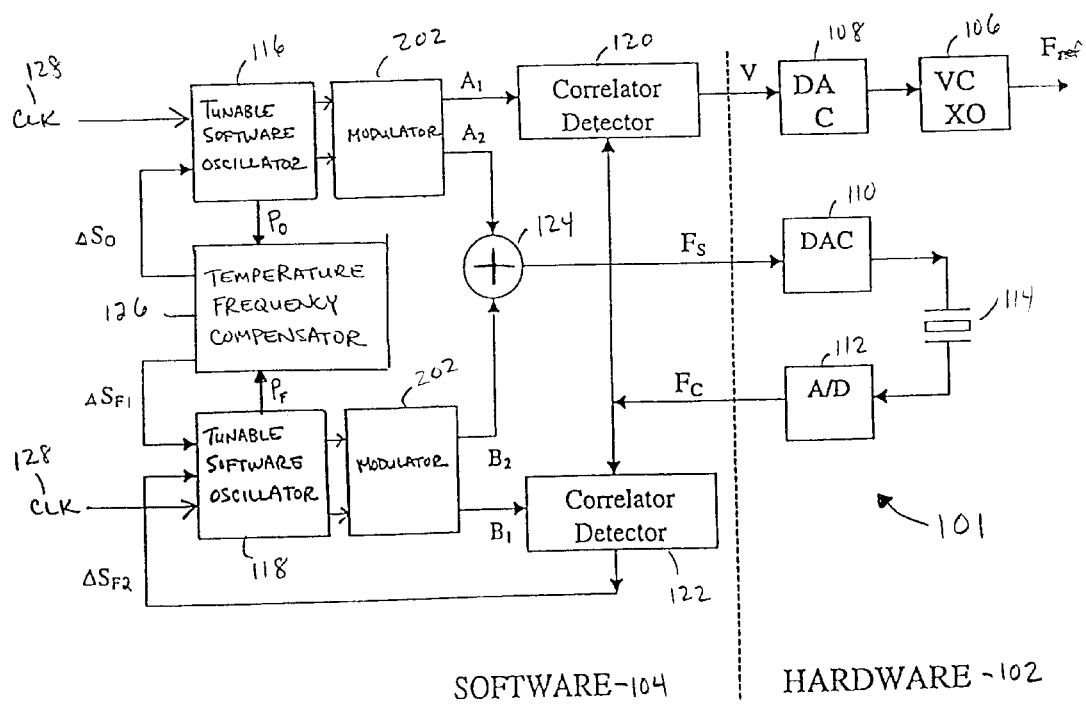
FIG. 2 is a system block diagram of a variation of the software controlled crystal oscillator of FIG. 1 in accordance with another embodiment of the present invention.
Figure 3:
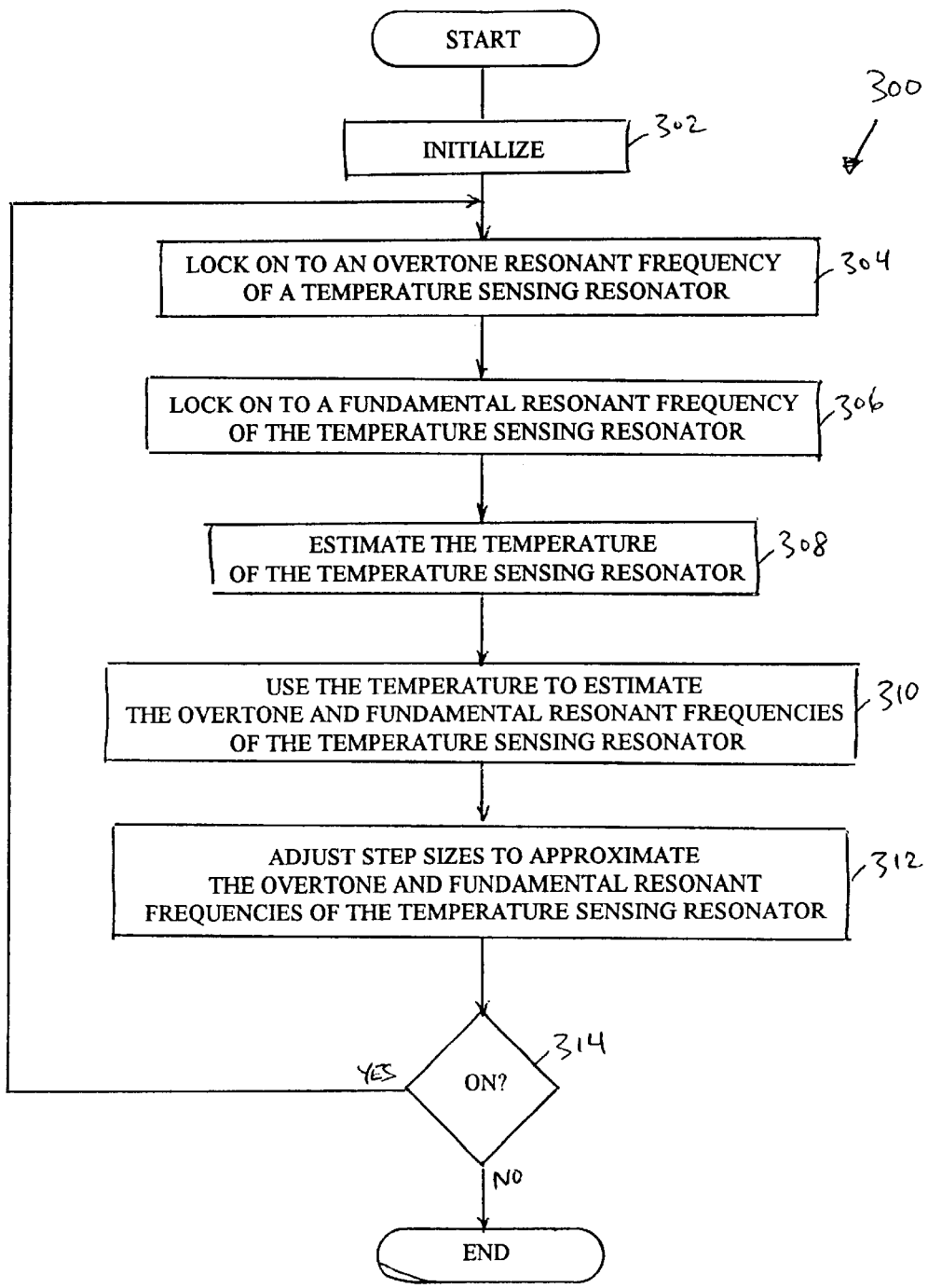
FIG. 3 is a flowchart of the steps performed by the software algorithm of the software controlled crystal oscillator of FIGS. 1 and 2 in order to control the reference frequency of an oscillator.
Figure 6:
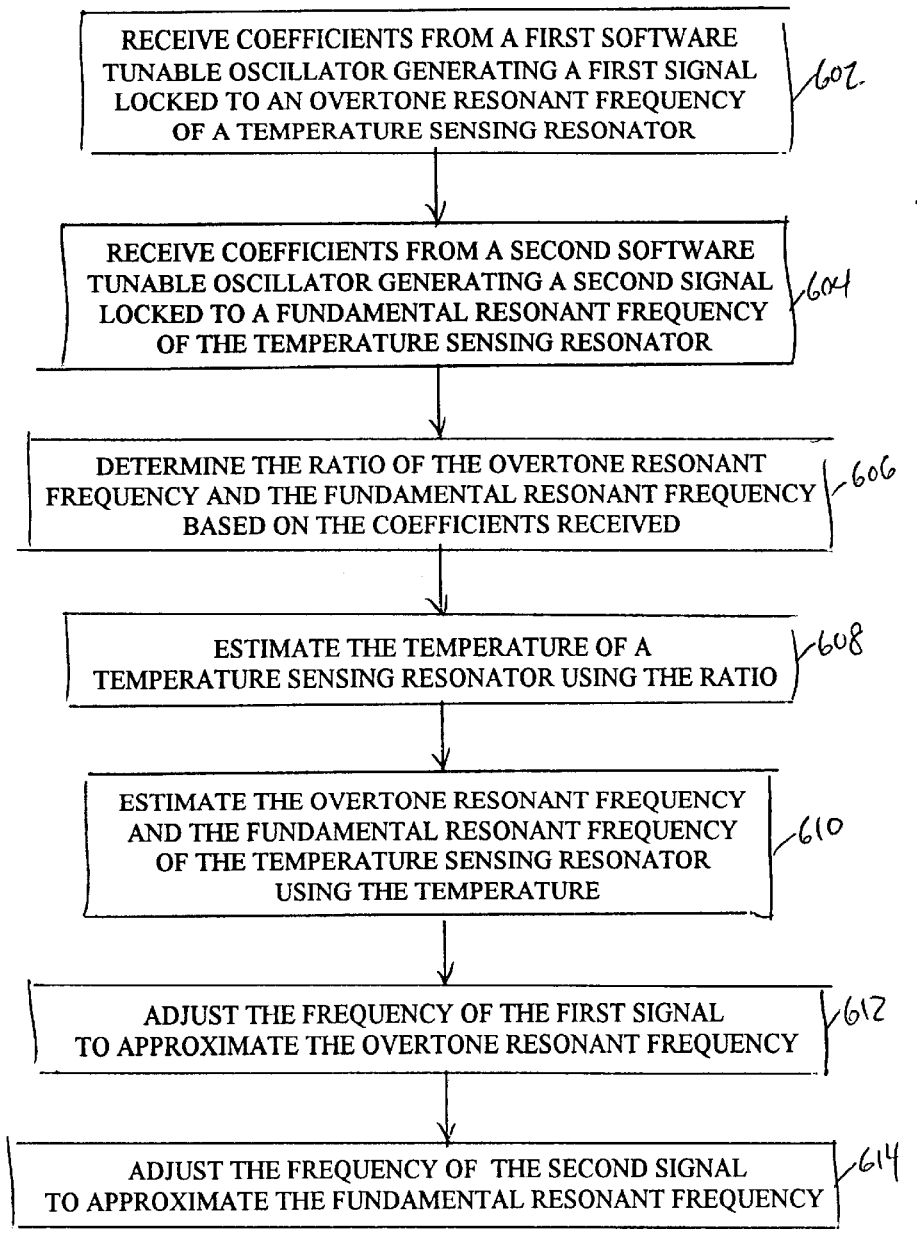
FIG. 6 is a flowchart of the steps performed by a temperature frequency compensator of the software algorithm of the software controlled crystal oscillator of FIGS. 1 and 2 in order to estimate the temperature of the temperature sensing resonator and make adjustments to compensate the reference frequency of a controllable oscillator based upon the temperature of the temperature sensing resonator as stated in the flowchart of FIG. 3.

Now, briefly referring to Steps 602 through 608 of FIG. 6, which illustrates a flowchart of the steps performed by the temperature frequency compensator 126 of the software algorithm of the software controlled crystal oscillator of FIG. 1 and also FIG. 2 in order to estimate the temperature of the temperature sensing resonator 114 and make adjustments to compensate the reference frequency of the controllable oscillator, e.g. the VCXO 106, based upon the temperature of the temperature sensing resonator, i.e. FIG. 6 illustrates the steps in performing Steps 308, 310 and 312 of FIG. 3.

First, the temperature frequency compensator 126 receives coefficients $P_O$ from the first tunable software oscillator 116 which is generating a digital signal locked to the overtone resonant frequency of the S/C cut crystal 114 (Step 602 of FIG. 6). Next, the temperature frequency compensator 126 receives coefficients $P_F$ from the second tunable software oscillator 118 which is generating a digital signal locked to the fundamental resonant frequency of the S/C cut crystal 114 (Step 604 of FIG. 6). These coefficients $P_O$ and $P_F$ are the most recently corrected step sizes for the digital signals produced by the first tunable software oscillator 116 and the second tunable software oscillator 118.

Next, based on the coefficients $P_O$ and $P_F$ received, the temperature frequency compensator 126 determines the ratio of the overtone resonant frequency and the fundamental resonant frequency (Step 606 of FIG. 6) by taking the ratio of the coefficients $P_O$ and $P_F$ (the step sizes), e.g. by using a floating point divide routine. Advantageously, since the values representing the overtone resonant frequency and the fundamental resonant frequency have an error associated therewith due to the unknown temperature, taking the ratio of these frequencies by taking the ratio of the coefficients cancels out the error. Thus, the ratio of the overtone resonant frequency and the fundamental resonant frequency should be the same regardless of whether there is an error present due to the unknown temperature or not.

Alternatively, instead of determining the ratio of the overtone resonant frequency to the fundamental resonant frequency (i.e. the ratio of the coefficients $P_O$ and $P_F$), the beat frequency may be estimated using the overtone/3 (i.e. overtone frequency divided by three) and the fundamental resonant frequencies. The beat frequency represents the difference between the overtone/3 and fundamental resonant frequencies. This is not a preferred method since the estimating the beat frequency does not eliminate the error or uncertainty in the overtone and fundamental resonant frequencies.

Next, following lookup tables stored or configured into the temperature frequency compensator 126, the temperature of the temperature sensing resonator 114 is estimated (Step 608 of FIG. 6 and also Step 308 of FIG. 3). It is well known in the art for a particular temperature sensing resonator, e.g. an S/C cut crystal 114, the ratio of the overtone resonant frequency, e.g. the third overtone resonant frequency, to the fundamental resonant frequency provides the temperature of the temperature sensing resonator. An example of such a lookup table is graphically shown in FIG.

7. Alternatively, instead of storing data represented graphically in memory, polynomials may be used to generate the appropriate value for the temperature. The use of such polynomials is known in the art.

Next, referring also back to FIG. 3, the temperature of the S/C cut crystal is used to estimate the overtone and the fundamental resonant frequencies of the S/C cut crystal 114 (Step 310 of FIG. 3 and also shown in Step 610 of FIG. 6). In this step, the overtone resonant frequency and the fundamental resonant frequency are looked up in a database of measured resonant frequencies vs. temperature which is specific to the selected S/C cut crystal 114. Graphical representations of such a database are illustrated with reference to FIGS. 8 and 9. Alternatively, instead of using a lookup table approach, the frequency values may be computed using polynomials, both of which are known in the art.

Next, once the exact overtone resonant frequency and the fundamental resonant frequency are known, the step sizes $S_O$ and $S_F$ of the first and second tunable software oscillators 116 and 118 are adjusted to the overtone resonant frequency and the fundamental resonant frequency, respectively (Step 312 of FIG. 3 and also Steps 612 and 614 of FIG. 6). This adjustment is performed by sending adjustment signals $\Delta S_O$ and $\Delta S_{F1}$ to the first and second tunable software oscillators 116 and 118, respectively, to adjust the step sizes $S_O$ and $S_F$. These adjustments $\Delta S_O$ and $\Delta S_{F1}$ represent corrections to the frequency of the signals produced by the first and second tunable software oscillators 116 and 118 based upon the temperature of the S/C cut crystal 114 and are used every time the temperature of the S/C cut crystal 114 is estimated. These adjustments may be positive or negative.

Now the first tunable software oscillator 116 and the second tunable software oscillator 118 are running at the correct frequency for that actual temperature. These adjustments to the first and second tunable software oscillators 116 and 118 result in the reference frequency of the controllable oscillator, e.g. the VCXO 106, being adjusted or compensated for the temperature of the S/C cut crystal 114. Thus, digital signals $A_1$, $A_2$, $B_1$ and $B_2$ ($A_2$ and $B_2$ which become $F_C$) are produced. Accordingly, the signal V produced by the first correlator detector 120 will force the output of the VCXO 106, i.e. the reference frequency $F_{ref}$, to the desired reference frequency, which is compensated for temperature.

Next, the software algorithm determines if the system is powered on (Step 314 of FIG. 3). If the system is still on, then Steps 304 through 312 are repeated. Thus, the SCXO 100 continually monitors the temperature of the S/C cut crystal 114 in order to adjust the reference frequency as the temperature varies. Advantageously, if the temperature changes, the SCXO 100 will respond by using the S/C cut crystal 114 passively as a temperature sensor and accordingly compensate the reference frequency for any changes in temperature. Advantageously, the embodiment of FIG. 1 provides a reference frequency $F_{ref}$ that has a stability of 1 part per billion (1 ppb), in comparison to a conventional microcomputer controlled crystal oscillator MCXO (20 ppb). If the power is no longer on, the software algorithm is terminated until the next time the system is powered on at Step 302 of FIG. 3.

Advantageously, the SCXO 100 of this embodiment provides a fully implemented digital controlled crystal oscillator. Advantageously, the physical size, power consumption, and expense of the oscillator is reduced. For example, the only analog components required are the first DAC 108, the second DAC 110, the ADC 112, the VCXO 106 and the S/C cut crystal 114. The remainder of the SCXO 100 is digitally implemented and may be embedded in a digital application, such as a GPS receiver microprocessor, or may be built into an ASIC for a given application.

Furthermore, the SCXO 100 uses the S/C cut crystal 114 as a passive filter instead of an active element. Conventional crystal oscillators use an S/C cut crystal 114 actively to generate the resonant frequencies that drive the reference frequency signal of a VCXO 106. Used actively, the SIC cut crystal requires power to be supplied and discrete devices, e.g. RLC filters, to remove unwanted frequencies and any noise generated. In contrast, the SCXO 100 uses the S/C cut crystal 114 passively as a temperature sensor, which does not require any power to be supplied. The signals generated to drive the VCXO 106 and sense the temperature of the S/C cut crystal 114 are generated by the first and second tunable software crystal oscillators. Thus, the signals input into the S/C cut crystal simply pass through the S/C cut crystal and additional discrete components are not needed to remove unwanted frequencies. The S/C cut crystal 114 is used to determine the temperature of the S/C cut crystal 114, which is used to adjust the signals produced by the first and second tunable software oscillators to produce a stable clock signal or reference frequency over a range of opearating temperatures.

Referring next to FIG. 2, a system block diagram is shown of a variation of the software controlled crystal oscillator of FIG. 1 in accordance with another embodiment of the present invention. The embodiment illustrated in FIG. 2 operates similarly to the embodiment of the SCXO of FIG. 1 except for the addition of the modulators 202, which couple to the digital signals output from both the first tunable software oscillator 116 and second tunable software oscillator 118, i.e. $A_1$, $A_2$, $B_1$ and $B_2$, to their respective destinations. The modulators 202 modulate the output digital signals and serve the function of helping to separate the overtone resonant frequency from the fundamental resonant frequency and also to help reject any interference between the overtone resonant frequency and the fundamental resonant frequency. For example, the modulation helps to reject noise from the fundamental resonant frequency into harmonic frequencies near the overtone resonant frequency. This is a departure from known MCXO designs, which neither use a digital oscillator, i.e. a tunable software oscillator, to drive a VCXO 106 nor use modulation for any purpose. Any modulation which will separate the overtone and fundamental resonant frequencies and preserves the phase integrity of the signals may be used, preferably binary phase shift key modulation (BPSK) is employed in the modulators 202. BPSK modulation and BPSK modulators are well known in the art.

As such, FIG. 4 includes the step of modulating the digital signals (Step 404 of FIG. 4), e.g. $A_1$ and $A_2$, in performing the locking on step 304 of FIG. 3. Similarly, FIG. 5 includes the step of modulating the digital signals (Step 504 of FIG. 5), e.g. $B_1$ and $B_2$, in performing the Locking on step 306 of FIG. 3.

In one embodiment, the first and second tunable software oscillators 116 and 118 may have the modulators 202 directly integrated in one functional unit, e.g. first and second tunable software oscillator and modulator units.

It is also noted that the software portion 104 of FIGS. 1 and 2 represents the functionality of the software algorithm of the software controlled crystal oscillator. As such, the blocks represent functional blocks of the software. For example, as understood in the art, there may be a single software routine that implements both the first and second tunable software oscillators 116 and 118 having different parameters (e.g. the step sizes, etc.). Likewise, a single software correlation routine may implement both the first and second correlator detectors 120 and 122 having different parameters or a single modulation routine may act as both modulators 202. Thus, the software may use a single routine to implement separate functional modules of the software algorithm.

Figure 7:
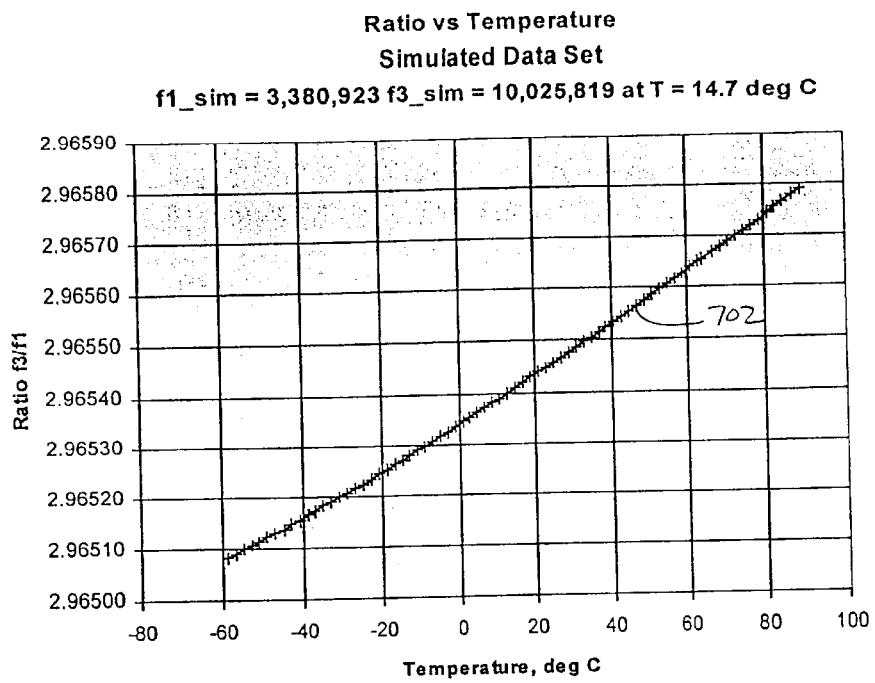
FIG. 7 is a graphical representation of the ratio of the overtone resonant frequency to the fundamental resonant frequency of a selected temperature sensing resonator in relationship to temperature, as used by the temperature frequency compensator of FIGS. 1 and 2 in order to determine the temperature of the temperature sensing resonator.

Referring next to FIG. 7, a graphical representation 702 is shown of the ratio of an overtone resonant frequency to a fundamental resonant frequency of a temperature sensing resonator in relationship to temperature, as used by the temperature frequency compensator 126 of FIGS. 1 and 2 in order to determine the temperature of the temperature sensing resonator (e.g., S/C cut crystal 114). With reference to FIG. 7 and also with reference to FIGS. 8 through 11, an SCXO was simulated to have a desired reference frequency $F_{ref}$ of 40 MHZ. The S/C cut crystal selected produces a fundamental resonant frequency of 3,380,923 Hz and a third overtone resonant frequency of 10,025,819 Hz at 14.7° C. (about 58.46° F.). Thus, the graphical representation 702 represents the ratio of the overtone to the fundamental resonant frequencies of this selected S/C cut crystal vs. temperature.

Advantageously, knowing the ratio of the overtone and the fundamental resonant frequencies as determined, for example, by the temperature frequency compensator in Step 606 of FIG. 6, the temperature of the S/C cut crystal may be determined with this graphical representation 702. For example, if the temperature frequency compensator determined the ratio to be 2.96560, then the temperature of the S/C cut crystal would be about 53° C.

Figure 8:
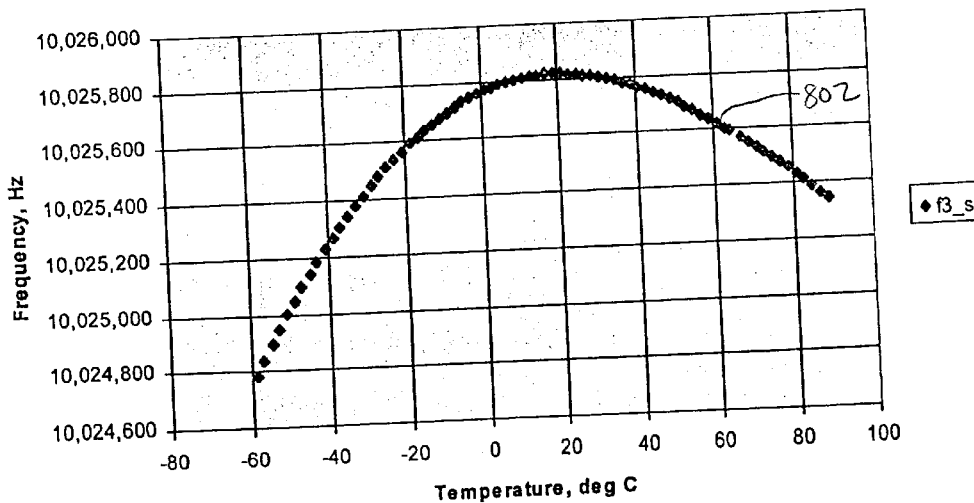
FIG. 8 is a graphical representation of the overtone resonant frequency of the selected temperature sensing resonator of FIG. 7 in relationship to temperature, as used by the temperature frequency compensator of FIGS. 1 and 2 in order to accurately estimate the overtone frequency of the temperature sensing resonator.

Referring next to FIG. 8, a graphical representation 802 is shown of the overtone resonant frequency of the temperature sensing resonator in relationship to temperature, as used by the temperature frequency compensator of FIGS. 1 and 2 in order to accurately estimate the overtone frequency of the temperature sensing resonator, i.e. the S/C cut crystal. This graphical representation is also stored in the temperature frequency compensator and is used to determine the exact value of the overtone resonant frequency given the temperature of the S/C cut crystal. This graphical representation 802 is specific to the S/C cut crystal having the characteristics mentioned above with reference to FIG. 7. This graphical representation is used in performing Step 310 of FIG. 3 and Step 610 of FIG. 6.

Figure 9:
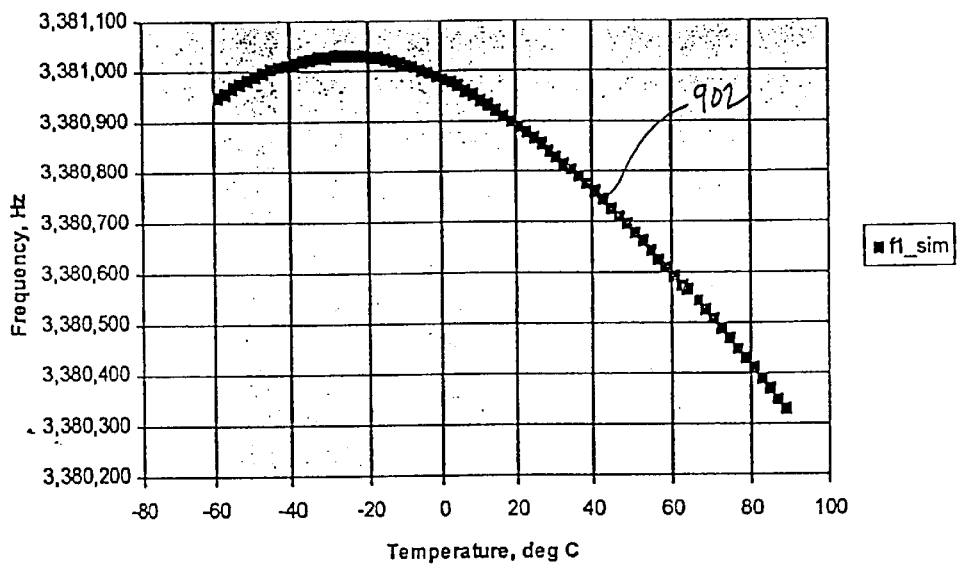
FIG. 9 is a graphical representation of the fundamental resonant frequency of the selected temperature sensing resonator of FIG. 7 in relationship to temperature, as used by the temperature frequency compensator of FIGS. 1 and 2 in order to accurately estimate the fundamental frequency of the temperature sensing resonator.

Referring next to FIG. 9, a graphical representation 902 is shown of the fundamental resonant frequency of the temperature sensing resonator in relationship to temperature, as used by the temperature frequency compensator of FIGS. 1 and 2 in order to accurately estimate the fundamental frequency of the temperature sensing resonator. This graphical representation 902 is also stored in the temperature frequency compensator and is used to determine the exact value of the fundamental resonant frequency given the temperature of the S/C cut crystal. This graphical representation 902 is specific to the S/C cut crystal having the characteristics mentioned above with reference to FIG. 7 and is used in performing Step 310 of FIG. 3 and Step 610 of FIG. 6.

Figure 10:
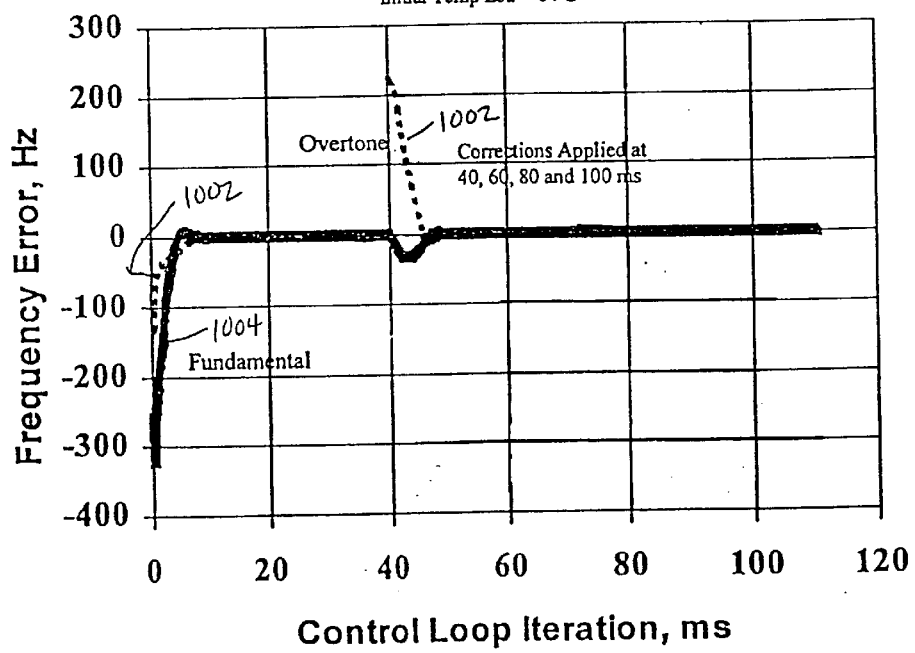
FIG. 10 is a graphical representation of the frequency error of the estimates of the overtone and fundamental resonant frequencies vs time in a simulation of the software controlled crystal oscillator of FIG. 2 using the temperature sensing resonator of FIGS. 7–9.

Referring next to FIG. 10, a graphical representation is shown of the frequency error of the estimates of the overtone 1002 and fundamental resonant frequencies 1004 vs time in a simulation of the software controlled crystal 101 of FIG. 2. The simulation of the SCXO uses the S/C cut crystal 114 having the characteristics mentioned above in FIG. 7. The temperature was simulated at 14.7° C., but was estimated erroneously at 64° C., which corresponds to an initial fundamental resonant frequency of 3,380,567.30 Hz and an initial overtone resonant frequency of 10,025,597.52 Hz. The VCXO error was set to be +400 Hz; thus, the VCXO 106 operated initially at 40,000,400 Hz, if the desired reference frequency $F_{ref}$ was to be 40 MHZ. The frequency error vs. time plot illustrates the error between the SCXO estimates of the fundamental 1004 and overtone 1002 resonant frequencies and the true values at 14.7° C. As is illustrated, the error is initially at about 100 Hz and about 320 Hz for the overtone and the fundamental frequencies, respectively and within 10 msec, was reduced to essentially zero error. Thus, within 40 msec, the lock up is complete, i.e. the first tunable software oscillator 116 is locked to the overtone resonant frequency (Step 304 of FIG. 3) and the second tunable software oscillator 118 is locked to the fundamental resonant frequency (Step 306 of FIG. 4), and the temperature frequency compensator 126 has performed Steps 308 and 310 of FIG. 3. At about 40 msec, corrections, i.e. $\Delta S_O$ and $\Delta S_{F1}$, are applied to the first and second tunable software oscillators 116 and,118 as applied from the temperature frequency compensator 126 (Step 312 of FIG. 3). These corrections force the reference frequency $F_{ref}$ to the desired value of 40 MHZ, but also induce an error between the estimates of the overtone and fundamental resonant frequencies and the actual overtone and fundamental resonant frequencies (which is shown just after 40 msec in FIG. 10). The corrections re-set the operating points of the first and second tunable software oscillators, which reacquire the overtone and fundamental resonant frequencies of the S/C cut crystal 114. Thus, with the correct operating point in the first and second tunable software oscillators, the reference frequency is forced to the desired value. Again, shortly after the corrections applied at about 40 msec, the error between the SCXO's estimates of the overtone 1002 and fundamental 1004 frequencies and the actual frequencies again approaches zero, typically within 10 msec.

Figure 11:
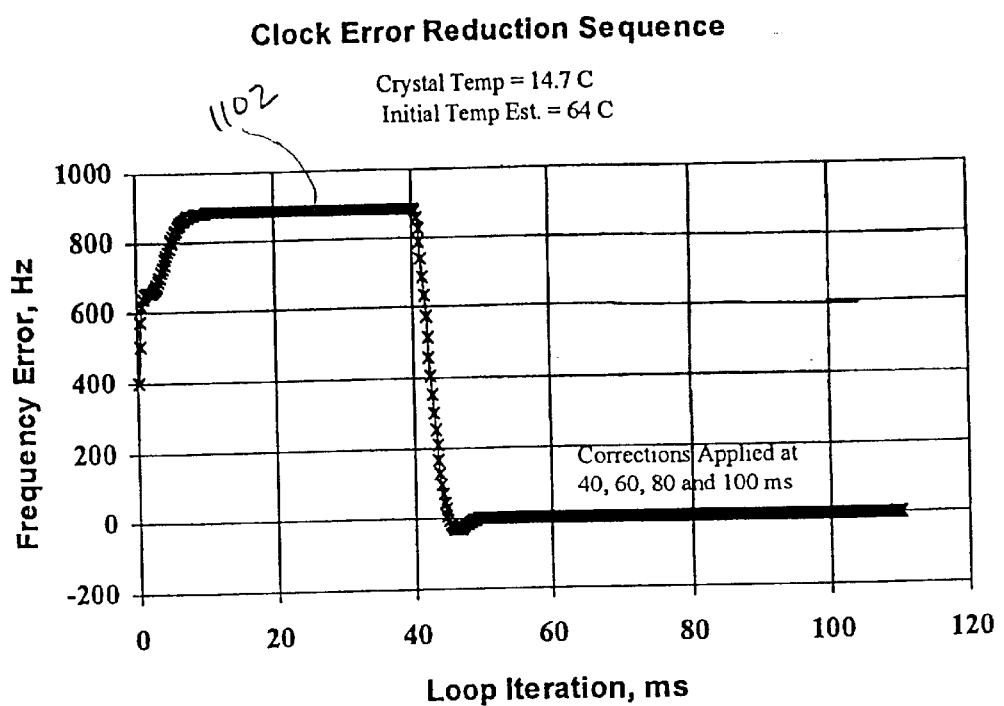
FIG. 11 is a graphical representation of the frequency error of the reference frequency vs time in a simulation of the software controlled crystal oscillator of FIG. 2 using the temperature sensing resonator of FIGS. 7–9.

Referring next to FIG. 11, a graphical representation 1102 is shown of the frequency error of the reference frequency $F_{ref}$ vs time in the simulation of the software controlled crystal oscillator 101 of FIG. 2 as described above in FIG. 10. As can be seen, the reference frequency is initially offset from the desired value by 400 Hz, i.e. $F_{ref}$ is 40,000,400 Hz. While the first and second tunable software oscillators are locking up to the overtone and fundamental resonant frequencies of the S/C cut crystal 114, the frequency error of the reference frequency increases to about 850 Hz, i.e. $F_{ref}$ is 40,000,850 Hz. As the temperature frequency compensator 126 applies the corrections, i.e. $\Delta S_O$ and $\Delta S_{F1}$ are changed at about 40 msec, the reference frequency $F_{ref}$ is rapidly forced to the desired value of 40 MHZ. Thus, advantageously within about 50 msec, the reference frequency is at the desired value of 40 MHZ.

The output reference frequency has a bias (accuracy) error of 2.7E—4 Hz error, and a standard deviation (precision) of 2.94E—2 Hz, and a stability of about 0.735 ppb. Furthermore, the SCXO simulation found the correct temperature at 14.7003° C. (i.e. by taking the ratio of the overtone to the fundamental resonant frequency and performing a lookup as in FIG. 7) and the total lock up time was slightly over 40 msec.

While the invention herein disclosed has been described by means of specific embodiments and applications thereof, numerous modifications and variations could be made thereto by those skilled in the art without departing from the scope of the invention set forth in the claims.

What is claimed is:

1. A method for digitally controlling a reference frequency of an oscillator comprising:

locking a first signal produced by a first tunable software oscillator on to a first resonant frequency of a temperature sensing resonator;

locking a second signal produced by a second tunable software oscillator on to a second resonant frequency of the temperature sensing resonator;

estimating a temperature of the temperature sensing resonator using the first signal and the second signal;

estimating the first resonant frequency and the second resonant frequency based upon the temperature;

adjusting the first signal to approximate the estimated first resonant frequency;

controlling the reference frequency of the oscillator based upon the first signal, wherein the reference frequency is compensated for temperature; and wherein the controlling comprises driving the temperature sensing resonator with a signal corresponding to the first signal to produce a first output.

2. The method of claim 1 wherein the signal has the same frequency as the first signal and is related in phase to the first signal.

3. The method of claim 1 wherein the signal is orthogonal to the first signal.

4. The method of claim 1 wherein the controlling further comprises correlating the first output with the first signal.

5. The method of claim 4 wherein the correlating comprises determining a phase error between the first signal and the first output.

6. The method of claim 4 wherein the controlling step further comprises determining, based upon the correlating, an adjustment to the oscillator.

7. The method of claim 6 wherein the controlling step further comprises outputting an adjustment signal to the oscillator based upon the adjustment for adjusting the reference frequency of the oscillator.

8. A method for digitally controlling a reference frequency of an oscillator comprising:

locking a first signal produced by a first tunable software oscillator on to a first resonant frequency of a temperature sensing resonator;

locking a second signal produced by a second tunable software oscillator on to a second resonant frequency of the temperature sensing resonator;

estimating a temperature of the temperature sensing resonator using the first signal and the second signal;

estimating the first resonant frequency and the second resonant frequency based upon the temperature;

adjusting the first signal to approximate the estimated first resonant frequency; and adjusting the second signal to approximate the estimated second resonant frequency.

9. The method of claim 8 wherein the first resonant frequency comprises an overtone resonant frequency.

10. The method of claim 8 wherein the second resonant frequency comprises a fundamental resonant frequency.

11. A method for digitally controlling a reference frequency of an oscillator comprising:

locking a first signal produced by a first tunable software oscillator on to a first resonant frequency of a temperature sensing resonator;

locking a second signal produced by a second tunable software oscillator on to a second resonant frequency of the temperature sensing resonator;

estimating a temperature of the temperature sensing resonator using the first signal and the second signal;

estimating the first resonant frequency and the second resonant frequency based upon the temperature;

adjusting the first signal to approximate the estimated first resonant frequency; and modulating, prior to the locking the first signal step, the first signal produced by the first tunable software oscillator.

12. The method of claim 11 further comprising modulating, prior to the locking the second signal step, the second signal produced by the second tunable software oscillator.

13. A method for digitally controlling a reference frequency of an oscillator comprising:

locking a first signal produced by a first tunable software oscillator on to a first resonant frequency of a temperature sensing resonator;

locking a second signal produced by a second tunable software oscillator on to a second resonant frequency of the temperature sensing resonator;

estimating a temperature of the temperature sensing resonator using the first signal and the second signal;

estimating the first resonant frequency and the second resonant frequency based upon the temperature;

adjusting the first signal to approximate the estimated first resonant frequency; and wherein the locking the first signal step comprises:

driving the temperature sensing resonator with a signal related in phase to the first signal to produce a first output;

correlating the first output with the first signal;

determining, based upon the correlating, an adjustment to the oscillator; and outputting an adjustment signal to the oscillator based upon the adjustment.

14. The method of claim 13 wherein the locking the first signal step further comprises clocking the first tunable software oscillator with the output of the oscillator having been adjusted.

15. The method of claim 14 wherein the locking the first signal step further comprises repeating the driving, correlating, determining, outputting and clocking steps until the adjustment approaches zero.

16. A method for digitally controlling a reference frequency of an oscillator comprising:

locking a first signal produced by a first tunable software oscillator on to a first resonant frequency of a temperature sensing resonator;

locking a second signal produced by a second tunable software oscillator on to a second resonant frequency of the temperature sensing resonator;

estimating a temperature of the temperature sensing resonator using the first signal and the second signal;

estimating the first resonant frequency and the second resonant frequency based upon the temperature;

adjusting the first signal to approximate the estimated first resonant frequency; and wherein the locking the second signal comprises:

driving the temperature sensing resonator with a signal related in phase to the second signal to produce a first output;

correlating the first output with the second signal;

determining, based upon the correlating, an adjustment to the second tunable software oscillator; and adjusting the second tunable software oscillator based upon the adjustment.

17. The method of claim 16 wherein the locking the second signal further comprises repeating the driving, correlating, determining and adjusting steps until the adjustment approaches zero.

18. A method for digitally controlling a reference frequency of an oscillator comprising:
   locking a first signal produced by a first tunable software oscillator on to a first resonant frequency of a temperature sensing resonator;
   locking a second signal produced by a second tunable software oscillator on to a second resonant frequency of the temperature sensing resonator;
   estimating a temperature of the temperature sensing resonator using the first signal and the second signal;
   estimating the first resonant frequency and the second resonant frequency based upon the temperature;
   adjusting the first signal to approximate the estimated first resonant frequency; and
   wherein the estimating the temperature comprises estimating the temperature of the temperature sensing resonator using a ratio of the frequency of the first signal having been locked and the frequency of the second signal having been locked.

19. The method of claim 18 wherein the estimating the temperature further comprises estimating the temperature of the temperature sensing resonator using a ratio of step sizes of the first tunable software oscillator and the second tunable software oscillator.

20. A software controlled crystal oscillator comprising:
   a controllable oscillator generating a reference frequency;
   a digital processor coupled to the controllable oscillator via a first digital to analog converter, wherein the digital processor controls the reference frequency of the oscillator;
   a temperature sensing resonator coupled to the digital processor via a second digital to analog converter; and
   an analog to digital converter coupling an output of the temperature sensing resonator to the digital processor, wherein the temperature sensing resonator produces a signal having a plurality of resonant frequencies that are related to each other by temperature, wherein the digital processor estimates the temperature of the temperature sensing resonator and controls the reference frequency based upon the temperature.

21. The software controlled crystal oscillator of claim 20 wherein the digital processor includes a first tunable software oscillator producing signals having a frequency approximating one of the plurality of resonant frequencies.

22. The software controlled crystal oscillator of claim 21 wherein the digital processor further includes a second tunable software oscillator producing other signals leaving a frequency approximating another of the plurality of resonant frequencies.

23. The software controlled crystal oscillator of claim 21 wherein the signals of the first tunable software oscillator are used to control the reference frequency.

24. The software controlled crystal oscillator of claim 23 wherein the first tunable software oscillator comprises a numerically controlled oscillator.

25. The software controlled crystal oscillator of claim 20 wherein the temperature sensing resonator comprises a strain compensated cut crystal.

26. The software controlled crystal oscillator of claim 20 wherein the digital processor performs the following steps:
   locking a first signal produced by a first tunable software oscillator on to one of the plurality of resonant frequencies of the temperature sensing resonator;
   locking a second signal produced by a second tunable software oscillator on to another one of the plurality of resonant frequencies of the temperature sensing resonator; and
   estimating the temperature of the temperature sensing resonator using the first signal and the second signal.

27. The software controlled crystal oscillator of claim 26 wherein the digital processor controls the reference frequency based upon the temperature by performing the following steps:
   estimating the one of the plurality of resonant frequencies and the other one of the plurality of resonant frequencies based upon the temperature;
   adjusting the first signal to approximate the estimated the one of the plurality of resonant frequencies; and
   controlling the reference frequency of the controllable oscillator based upon the first signal, wherein the reference frequency is compensated for temperature.

28. A system for controlling a reference frequency of an oscillator comprising
   a processor including a program for performing the following steps:
      locking a first signal produced by a first tunable software oscillator on to a first resonant frequency of a temperature sensing resonator;
      locking a second signal produced by a second tunable software oscillator on to a second resonant frequency of the temperature sensing resonator;
      estimating a temperature of the temperature sensing resonator using the first signal and the second signal;
      estimating the first resonant frequency and the second resonant frequency based upon the temperature; and
      adjusting the first signal to approximate the estimated first resonant frequency; and
   wherein estimating the temperature comprises estimating the temperature of the temperature sensing resonator using a ratio of the frequency of the first signal having been locked and the second signal frequency of the second signal having been locked.

29. The system of claim 28 wherein the processor further performs the step of controlling the reference frequency of the oscillator based upon the first signal, wherein the reference frequency is compensated for temperature.

30. A system for controlling a reference frequency of an oscillator comprising:
   a first tunable software oscillator producing a signal to be output to a temperature sensing resonator;
   a first correlator detector coupled to the first tunable software oscillator, the first correlator detector having an output to control the oscillator that produces the reference frequency;
   a second tunable software oscillator producing another signal to be output to the temperature sensing resonator;
   a second correlator detector coupled to the second tunable software oscillator;
   an input for receiving an output signal from the temperature sensing resonator, wherein the input is coupled to the first correlator detector and the second correlator detector; and
   a temperature frequency compensator coupled to the first tunable software oscillator and the second tunable software oscillator, wherein the temperature frequency compensator estimates the temperature of the temperature sensing resonator and adjusts the frequency of the signal and the other signal based upon the temperature.

31. The system of claim 30 further comprising a summer coupled to the first tunable software oscillator and the second tunable software oscillator, wherein the summer sums the signal and the other signal and outputs an input signal to the temperature sensing resonator.

32. The system of claim 31 further comprising a first modulator coupling the first tunable software oscillator to the first correlator detector and to the summer.

33. The system of claim 31 further comprising a second modulator coupling the second tunable software oscillator to the second correlator detector and to the summer.

34. The system of claim 30 wherein said first tunable software oscillator and said second tunable software oscillator comprise respectively a first numerically controlled oscillator and a second numerically controlled oscillator.

35. A method of using a temperature sensing resonator as a filter for controlling a reference frequency of an oscillator comprising:

digitally generating a first clock signal and a second clock signal, wherein the first clock signal and the second clock signal have the same frequency and the second clock signal is related in phase to the first clock signal;

driving the temperature sensing resonator with the second clock signal;

correlating the first clock signal with an output of the temperature sensing resonator; and generating, in response to the correlating, a signal to be output to the oscillator, wherein the signal controls the reference frequency of the oscillator.

36. The method of claim 35 wherein the second clock signal and the first clock signal are orthogonal to each other.

37. The method of claim 35 further comprising compensating the first clock signal and the second clock signal based upon the temperature of the temperature sensing resonator.

38. The method of claim 35 wherein the temperature sensing resonator comprises a strain compensated cut crystal.

39. The method of claim 35 wherein the frequency of the first clock signal and the second clock signal is a resonant frequency of the temperature sensing resonator.

* * * * *